United States Patent [19]

Brock-Nannestad

[11] 4,360,914

[45] Nov. 23, 1982

[54] PROCESS AND AN APPARATUS FOR TRANSFERRING INFORMATION REPRESENTING AT LEAST TWO PARAMETERS

[75] Inventor: Lars V. Brock-Nannestad, Virum, Denmark

[73] Assignee: Forsvarets Forskningstjeneste, Denmark

[21] Appl. No.: 201,072

[22] PCT Filed: Nov. 30, 1979

[86] PCT No.: PCT/DK79/00054

§ 371 Date: Jul. 25, 1980

§ 102(e) Date: Jul. 25, 1980

[87] PCT Pub. No.: WO80/01228

PCT Pub. Date: Jun. 12, 1980

[30] Foreign Application Priority Data

Dec. 1, 1978 [DK] Denmark .............................. 5471/78

[51] Int. Cl.³ .............................................. G06F 3/14
[52] U.S. Cl. ...................................... 371/2; 364/570; 364/745
[58] Field of Search ........................ 371/2, 37, 40, 47; 364/745, 749, 570, 581

[56] References Cited

U.S. PATENT DOCUMENTS

| | | | |
|---|---|---|---|
| 3,381,273 | 4/1968 | Stark et al. ............................ | 371/37 |
| 3,412,380 | 11/1968 | Heller et al. ........................... | 371/37 |
| 3,569,685 | 3/1971 | Chesley ................................. | 364/749 |
| 3,842,206 | 10/1974 | Barselloti et al. .................... | 179/2 A |
| 3,859,514 | 1/1975 | Kashio .................................. | 364/745 |
| 4,027,301 | 5/1977 | Mayer .................................. | 340/183 |
| 4,041,453 | 8/1977 | Umeda et al. ........................ | 371/2 |
| 4,222,072 | 9/1980 | Bailey et al. ......................... | 371/2 |

FOREIGN PATENT DOCUMENTS 977876 12/1964 United Kingdom.
1377374 12/1974 United Kingdom.

OTHER PUBLICATIONS

A. G. Franco, Coding For Error-Free Communications, Electro-Technology, Jan. 1968, pp. 53–62.

Primary Examiner—Charles E. Atkinson
Attorney, Agent, or Firm—Kane, Dalsimer, Kane, Sullivan and Kurucz

[57] ABSTRACT

A process and an apparatus for transferring information representing a plurality of parameters which are each indicated by a plurality of digits of different weight. The parameters may represent a plurality of measurable states of an arbitrary type, e.g. two coordinates on a display, the parameter value being a measure of the state. The most important digit is first transferred from all the parameters in a predetermined sequence, and then the digit next in importance from all the parameters in the same predetermined sequence, and so on, until a desired accuracy or resolubility for the parameter values has been achieved, depending upon the state of operation, and transfer of information is then discontinued so that the row of digits is not necessarily transferred entirely.

3 Claims, 3 Drawing Figures

PROCESS AND AN APPARATUS FOR TRANSFERRING INFORMATION REPRESENTING AT LEAST TWO PARAMETERS

The invention relates to a process for transferring information representing a plurality of parameters which are each defined by a plurality of measureable states of an arbitrary type, the parameter value being a measure of the state. The invention will be explained below substantially with respect to the case where there are two parameters which define their respective coordinates in a two-dimensional system of co-ordinates. If the system of co-ordinates e.g. belongs to a display, a great number of associated parameter values may define an image matrix used for optical reading of e.g. alphanumeric characters.

The resolubility of the parameters depends upon the number of digits each parameter contains in a given system of notation. As the time of information transfer is proportional to the total number of digits it will be appreciated that a known serial transfer of all the parameter digits will take an unnecessary long time if, in a given case, a significantly lower resolubility will suffice, e.g. for representing an image of a number, than is needed to represent a more complicated pattern.

The object of the invention is to provide a process for transferring information from two or more data sources, in which the information is serially transferred in data groups each of which contains a single bit from each data source, said process permitting a variable resolubility to be achieved in a very simple manner so that the transfer of information may be adapted in particular to rate of transfer and sensivitity to noise, depending upon the necessary and sufficient resolubility.

This object is achieved by arranging each data source so as to represent a parameter, such as a co-ordinate in a system of co-ordinates, so that the weight of each digit in a parameter represents a predetermined digit position in the corresponding data source and by interrupting the transfer of the row of digits thus produced when the transferred partial row represents each parameter with a predetermined accuracy. By combining the features of a front portion of the digit row representing with reduced resolubility all the parameters and of interrupting the transfer of the row, as stated, the resolubility and transmission time can be varied according to the number of digits in sequence which are included in the transfer of information.

As the weight of the digits in said row of digits thus gradually decreases, it is expedient to have the digit of the greatest weight, which originates from the most important parameter to be transferred, in the front of the sequence.

As according to the invention the digits are arranged in groups of uniform weight, there will be empty places in the sequence of the digits if only one of the parameters contains fewer digits than the other parameters. These empty places may advantageously be used for digits for error detection or flag characters.

The invention is not restricted to a specific system of notation since each digit may be represented by an electric voltage having a plurality of discrete voltage levels corresponding to the radix of the system of notation. Owing to modern technology developed for binary information, the invention is preferably carried out in the binary system of notation.

The invention also relates to an apparatus for carrying out the process. The apparatus is characterized by the coupling of registers, which in connection with said buffer register provides simple means for dynamic variation of resolubility, the buffer register being arranged to transfer its information to the main register when the plurality of digits necessary for the desired resolubility has been read from the lastmentioned register in the sequence, the remaining portion of the digits in the digit row being erased by parallel transfer of the information in the buffer register to the main register.

In addition to the examples already mentioned, the invention is a great value in many other applications. For process monitoring e.g., the invention allows a large number of parameters to be monitored rapidly in succession with a relatively rough resolubility corresponding to predetermined maximum and minimum values of the parameters, and permits an automatic increase in resolubility for accurate determination of a parameter value which in the rough resolubility should exceed the predetermined limits. Similar advantages can be achieved in connection with recognition of two or multidimensional patterns, e.g. in connection with radar images, aids for the partially sighted, detecting of the outline of objects on a conveyor belt, etc.

The invention will be explained in more detail in the following description of some embodiments with reference to the drawing, in which.

Figure 1:
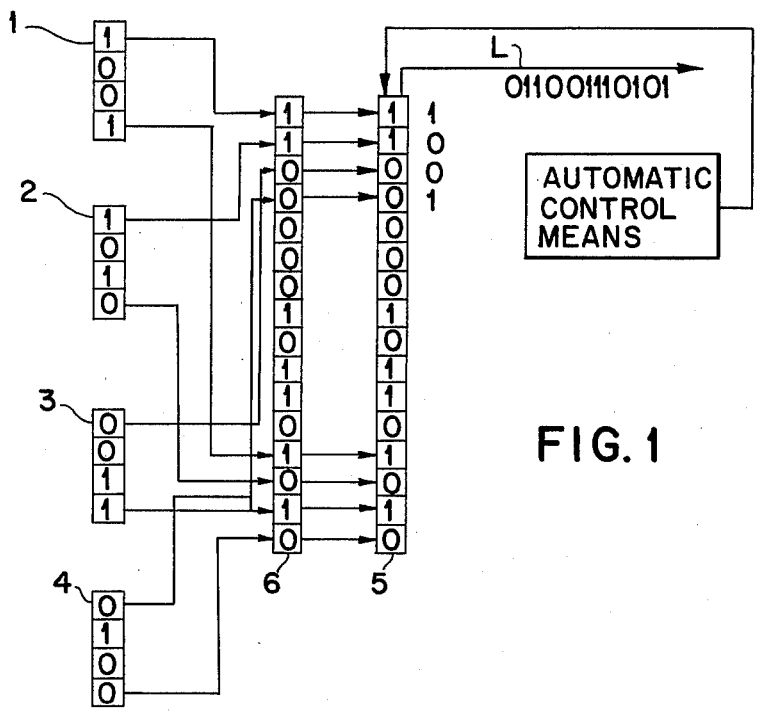
FIG. 1 shows a first embodiment of the apparatus of the invention.

FIG. 1 shows a first embodiment of the apparatus of the invention, said embodiment comprising a plurality of registers 1, 2, 3 and 4, a main register 5 as well as a buffer register 6 for the main register 5. The registers 5 and 6 contain sixteen places numbered from top to bottom, while the other registers each contain four places, likewise numbered from top to bottom in the register concerned. The registers 1, 2, 3 and 4, thus contain the decimal numbers 9, 10, 3 and 4, respectively.

The registers 1, 2, 3 and 4 may contain values of measurement from a process monitoring system which it is desired to transmit serially to a central receiver via a lead L. The duration of this transfer of information will be proportional to the number of bits to be transferred, which in this case is 16, but in other instances where many more registers of the type 1, 2, 3 and 4 are present, the transfer of information may take an excessively long time, particularly when the system is in a monitoring state where only a rough indication of the many process parameters is desired.

It being assumed for the present purposes that information from the registers 1, 2, 3 and 4 is supplied directly through the buffer register 6 to the main register 5, the registers 1, 2, 3 and 4 are coupled to the main register 5, as appears from FIG. 1 (for clarity the figure only shows the connections to the first and the last places, the other connections being provided in fundamentally the same manner), and which entails that the first four places in the main register 5 contain the most important bits from each of the registers 1, 2, 3 and 4, respectively. The places 4–8 in the main register 5 contain the four bits of place No. 2 in each of the registers 1, 2, 3 and 4, and so on. This has the advantage that the row of digits read serially from the top of the main register 5 begins with the most important bits from each of the parameter registers and ends with the least important bits in each of the parameter registers. The receiver (not shown) may then be so arranged that it receives only a front fraction of the row of digits on the lead L, depending upon the resolubility which is desired in the given case. In addition to the example already mentioned, the resolubility may e.g. be diminished if, for a while, there is much noise in the system. It being well-known that the probability of errors in the reception of the sequence of the digits increases with the number of digits transferred, e.g. owing to errors of synchronization, the invention provides the additional advantage that such errors will with the greatest probability spread on the least important bits, while the most important bits from each parameter register will be transferred with less probability of errors.

Instead of the receiver being arranged to cut-off the last fraction of the digit sequence on the lead L, the buffer register 6 may according to the invention operate in the following manner. The buffer register 6 is a parallel-in/parallel-out register which serves as an intermediate store for information to the main register 5, and is arranged to transfer its information to the main register 5 when the desired front fraction of the preceding row of digits has been read to the lead L. This means that only twelve bits are read to the lead L in the example shown in FIG. 1; the last four bits (1001) are not read out, but are erased and replaced by the new row of digits from the buffer register 6. The timing of the transfer from the buffer register 6 to the main register 5 thus decides the number of bits which in the preceding digit sequence are read to the lead L. Each row of digits on the lead L can be enlarged so as to contain parity bits and flag characters so that error detection may be effected in the receiver.

Figure 2:
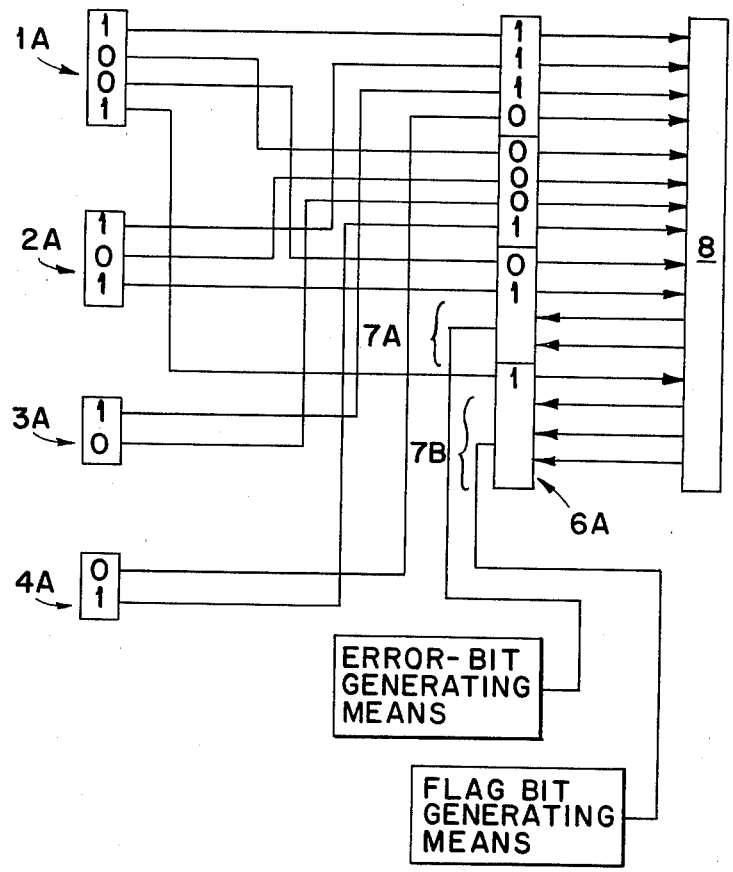
FIG. 2 shows another embodiment.

Flag characters and digits for error correction may, in particular when the source registers do not contain equally many storage cells, be expediently inputed by means of the embodiment shown in FIG. 2, where the main register 5 in FIG. 1 is omitted for clarity. The embodiment shown in FIG. 2 corresponds in principle to the embodiment shown in FIG. 1 it being observed that the source registers 1A, 2A, 3A, and 4A contain four, three, two and two storage cells, respectively, and that an additional logic circuit 8 is provided.

FIG. 2 shows all the connections between the source registers 1A, 2A, 3A, and 4A and the buffer register 6A, and since the registers 3A and 4A only contain two storage cells each, it will appear that there are two vacant storage cell places (7A) in the third storage group of the buffer register 6A. Similarly, there are three vacant storage cells (7B) in the fourth storage group. The logic circuit 8 is arranged to receive information from all the buffer register cells which receive information from the source registers 1A, 1B, 1C and 1D and to produce auxiliary digits on the basis of this which are transferred to the buffer register cells 7A, 7B. Flag characters may e.g. be transferred to the cells 7A, from flag character generating means 31 and error correcting digits may be introduced in the cells 7B from error-correcting digit generating means 32.

This embodiment may e.g. be used in a process monitoring system with many source registers in which some registers (1A) may contain many digits for accurate parameter values, while other registers contain fewer digits, where e.g. two digits (the registers 3A, 4A) may indicate whether a valve is open or closed. If it is of great importance to know whether a valve is open or closed, high priority will be accorded to the associated source register, i.e. it is disposed at the front in the sequence 1A, 2A, 3A, 4A . . . , and it will then be understood that, roughly, process monitoring may be effected by using a shortened row of digits in the buffer register and main register, respectively. If the predetermined parameter values deviate outside a relatively rough margin, a larger fraction of the row of digits, perhaps the entire row of digits may be included by using automatic control means (not described here) so as to provide more detailed and accurate information about the state of the process system.

Cutting off of a last part of the digit sequence on the lead L does not have to take place at a time when the same number of bits from each of the parameter registers have been transferred, but may also be effected at a time when the bit last transferred is supplied by the parameter register 1 or 1A so that the parameter value in that register is transferred with greater accuracy than the parameter values in the other registers.

Figure 3:
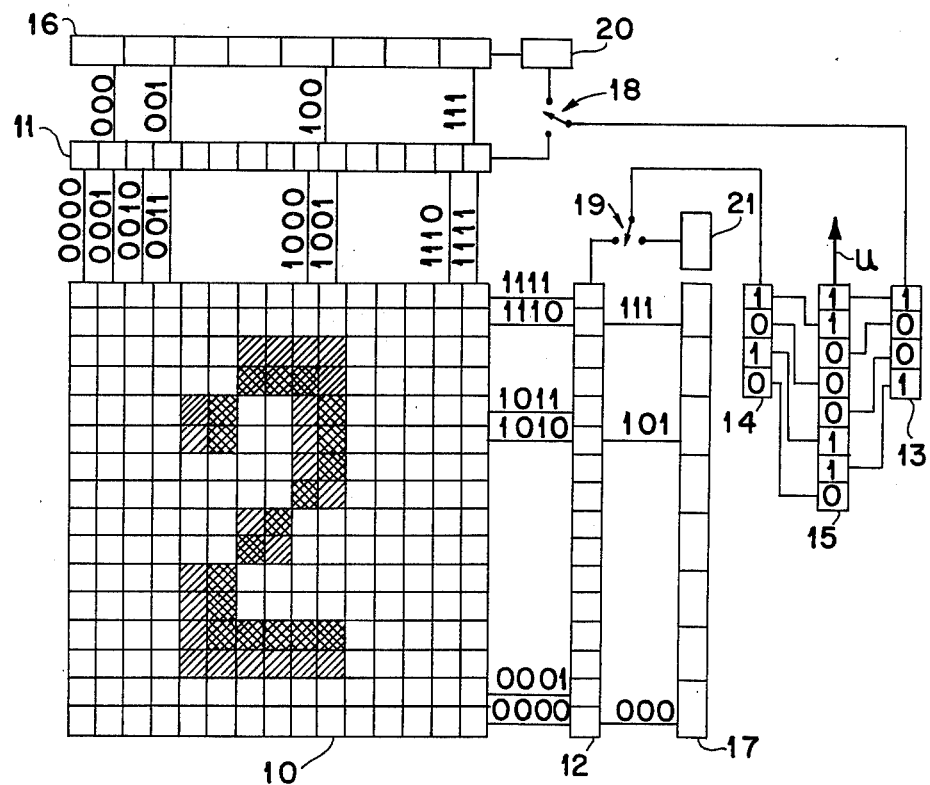
FIG. 3 shows still another embodiment in connection with a light-sensitive matrix for optical reading of twodimensional patterns.

FIG. 3 shows a known light-sensitive matrix 10 with 256 image plots and with associated scanning registers 11, 12. The co-ordinates of the image plots are indicated by binary numbers, as shown in FIG. 3, and in a preferred scanning method of the registers 11, 12 the co-ordinates of the matrix plots receiving a light intensity above a given threshold value will appear on the outputs thereof. In the figure the double-hatched areas indicate the number 2, the co-ordinates of the area stressed by a full line being 1001, 1010, which sets of co-ordinates will be followed below, it being remembered that the other co-ordinates, which together define the number 2, are read according to a predetermined pattern and treated in the same manner as will be described below for the arbitrarily selected area indicated by a full line in the matrix 10.

At a certain time during the scanning process the co-ordinates 1001, 1010 will thus be read from the registers 11 and 12, respectively, and be transferred in respective registers of co-ordinates 13 and 14, where the most important bit is at the top of the registers shown in the figure. The information in the registers 13, 14 is transferred, according to the invention, to a main register 15, as appears from the shown connections between the storage cells of the registers, which entails that a row of digits like the one on the lead L in the FIG. 1 will be produced on the serial output U from the main register 15.

In the operation described above the maximum resolubility of the matrix 10 is utilized, which may be useful in connection with complicated patterns, but transfer of an image of a number does not necessitate maximum resolubility. This appears from FIG. 3 which shows that the number 2 may easily be recognized on the basis of the single- or double-hatched areas which in size correspond to 64 such areas in the maxtrix 10. The latter areas may be represented by co-ordinates each of which only contains three binary bits that may be transferred to the shown scanning registers 16 and 17 which for the purpose of reading out are arranged in the same manner as the scanning registers 11 and 12. The shown converters 18 and 19 provide for conversion to a situation in which only three co-ordinate bits are transferred to the registers 13 and 14. The bit in the registers 13 and 14 which is not used may then be picked up by a parity bit for the co-ordinate information, and said parity bits may then be input by means of a circuit 20 and 21.

The embodiment in FIG. 3 provides a digit sequence on the output U by means of the converters 18 and 19 where the resolubility of the respective co-ordinates differs. For example, in the transfer of information representing the image of a number, information from the scanning registers 11 and 17 might be read so as to provide for the accommodation of a single parity bit in the digit sequence on the output U with good resolubility, the greatest resolubility being achieved in the width, and less resolubility in the height, corresponding to the fact that numbers are usually narrow and tall.

The embodiment shown in FIG. 3 may of course be enlarged to transfer of co-ordinates for three- or multi-dimensional information where further co-ordinates might e.g. contain information about the intensity of the basic colours in a colour image. Similarly, there should be more co-ordinate registers with connections according to the invention to a longer main register. Each co-ordinate register and the main register may then have interposed between them a buffer register, as was explained in connection with FIGS. 1 and 2.

I claim:

1. A method for transferring from data sources bits of information relating to a plurality of parameters, each of said parameters being defined by digits having a weight associated therewith, wherein the weight of each digit corresponds to its importance, the most important digit having the highest weight, the second most important digit having a lower weight, and so on said method comprising the steps of:
   (a) arranging the digits of each data source by weight;
   (b) transferring the digits into a multi-section memory bank by placing all the digits with the highest weight from each data source in a first section, all the available digits with the second highest weight in a second adjacent section and so on;
   (c) reading the digits out of said memory bank serially in descending weight sequence; and,
   (d) terminating the out reading of digits from said memory bank when said parameters have been read with a predetermined accuracy.

2. The method of claim 1 wherein some of the parameters are defined by a lower number of bits than others, comprising the step of adding a flag, parity, or error-correcting bit to the section of the memory bank associated with the data sources related to said some parameters.

3. The method of claim 2 wherein one of the parameters has a higher priority than the others and wherein the bits associated with the higher priority parameter are placed at the front of the bits within a multi-section.

* * * * *